(12) United States Patent
Adiga et al.

(10) Patent No.: US 12,254,645 B2
(45) Date of Patent: Mar. 18, 2025

(54) SHAPE INVARIANT METHOD FOR ACCURATE FIDUCIAL FINDING (71) Applicant: FEI Company, Hillsboro, OR (US)

(72) Inventors: Umesh Adiga, Portland, OR (US); Mark Biedrzycki, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 495 days.

(21) Appl. No.: 17/457,622

(22) Filed: Dec. 3, 2021

(65) Prior Publication Data

US 2023/0177715 A1 Jun. 8, 2023

(51) Int. Cl.
| | |
|---|---|
| *G06T 7/70* | (2017.01) |
| *G06T 3/40* | (2024.01) |
| *G06T 7/00* | (2017.01) |
| *G06T 7/13* | (2017.01) |
| *G06T 7/30* | (2017.01) |
| *G06V 10/25* | (2022.01) |
| *H01J 37/22* | (2006.01) |
| *H01J 37/31* | (2006.01) |

(52) U.S. Cl.
CPC .............. *G06T 7/70* (2017.01); *G06T 3/40* (2013.01); *G06T 7/0004* (2013.01); *G06T 7/13* (2017.01); *G06T 7/30* (2017.01); *G06V 10/25* (2022.01); *H01J 37/222* (2013.01); *H01J 37/31* (2013.01); *G06T 2207/10061* (2013.01); *G06T 2207/30164* (2013.01); *G06T 2207/30204* (2013.01)

(58) Field of Classification Search
CPC ... G06T 7/11; G06T 7/13; G06T 2207/30148; G06T 2207/10056; G06T 2207/30168; G06T 7/00; G06T 2207/20132; G06T 7/10; G06T 2207/10061; G06T 2207/30204; G06T 2207/20192; G06T 1/0007; G06V 10/25; G06V 10/764; G06V 10/462; G06V 40/161; G06V 10/40; G06V 20/46; G06V 40/172; G06V 10/267; G06V 20/58; G06V 40/168; G06V 20/698; G06V 40/1365; G06V 10/443; G06V 40/1347; G06V 40/193
See application file for complete search history.

(56) References Cited

U.S. PATENT DOCUMENTS

| | | | | |
|---|---|---|---|---|
| 5,083,214 A | * | 1/1992 | Knowles | H04N 1/38 358/448 |
| 8,879,813 B1 | * | 11/2014 | Solanki | G06F 16/583 382/128 |
| 2003/0053714 A1 | * | 3/2003 | Esaki | G06V 10/44 382/287 |
| 2007/0092129 A1 | * | 4/2007 | Sugiyama | H01J 37/222 382/145 |

(Continued)

FOREIGN PATENT DOCUMENTS

| | | | | | |
|---|---|---|---|---|---|
| EP | 3627225 A1 | * | 3/2020 | | G03F 7/2026 |
| JP | 2012022903 A | * | 2/2012 | | |

*Primary Examiner* — Chan S Park
*Assistant Examiner* — Sebastian-Sy Vuchi Ngo
(74) *Attorney, Agent, or Firm* — Klarquist Sparkman, LLP (57) ABSTRACT Fiducial coordinates are obtained by aligning template with region of interest extracted from a workpiece image. Image values in the region of interest are projected along a template axis and the project values evaluated to establish a fiducial location which can be used as a reference location for locating workpiece areas for ion beam milling or other processing.

19 Claims, 7 Drawing Sheets (56) References Cited

U.S. PATENT DOCUMENTS

| | | | | |
|---|---|---|---|---|
| 2010/0092070 A1* | 4/2010 | Young | ................. | H01L 22/12 |
| | | | | 382/151 |
| 2012/0328151 A1* | 12/2012 | Warschauer | .......... | G06T 7/0004 |
| | | | | 382/103 |
| 2020/0167943 A1* | 5/2020 | Kim | ................. | G06T 7/579 |
| 2020/0279905 A1* | 9/2020 | Nandakumar | .......... | H01L 28/20 |
| 2022/0130031 A1* | 4/2022 | Woodard | ............. | G06T 7/0006 |

* cited by examiner

SHAPE INVARIANT METHOD FOR ACCURATE FIDUCIAL FINDING

FIELD

The disclosure pertains to workpiece alignment using fiducials.

BACKGROUND

Various procedures in the manufacture and evaluation of semiconductor and other devices require determining precise coordinates of any regions of interest on the device. To aid in locating a selected region, devices and device substrates are provided with fiducials which can permit substrate alignment. Fiducials generally include features intended for orienting a substrate with respect to orthogonal linear axes (i.e., X- and Y-axes) and in some cases, angular alignment with respect to these axes as well.

In some applications, multiple regions of interest must be located and fiducials proximate the regions are identified and used for location-finding. An operator can place a substrate in a field-of-view of an imaging system and use edges defined by the fiducial to establish coordinates. This operator intervention can be time-consuming and error prone. Operators can be required to locate fiducials generally, obtain multiple images of a workpiece, and place reference markers with respect to the fiducials prior to additional image processing to determine precise locations. Fiducials of different shapes typically require different processing approaches which can be complex and time-consuming to implement. Alternative approaches are needed, particularly approaches that reduce demands for operator intervention.

SUMMARY

Methods comprise obtaining an image of a workpiece at a first resolution and identifying a workpiece fiducial in the image and selecting a portion of the image of the workpiece at the first resolution that includes a workpiece fiducial image as a region of interest (ROI) image. The ROI image is processed so that the ROI image has a second resolution that is greater than the first resolution. The ROI image is masked with a template based on the workpiece fiducial and processed as masked to establish at least one workpiece coordinate associated with the workpiece fiducial. In some examples, the template is a binary template and the at least one workpiece coordinate is established by projecting image values along at least one template axis and processing the projected image values.

Dual charged particle beam (CPB) systems comprising an electron microscope column situated to produce an image of a workpiece, an ion beam column situated to process the workpiece with an ion beam, and a memory device coupled to store at least one template associated with a workpiece fiducial design. A processor is coupled to select a portion of the image of the workpiece at the first resolution that includes a workpiece fiducial image as a region of interest (ROI) image, process the ROI image so that the ROI image has a second resolution that is greater than the first resolution, mask the ROI image with a template based on the workpiece fiducial, and process the masked ROI image to establish at least one workpiece coordinate associated with the workpiece fiducial. The processor can be further configured to direct the ion beam to a workpiece location based on the at least one workpiece coordinate to process a selected workpiece area based on the established workpiece coordinates such as ion beam mill the workpiece. In some examples, the at least one template is a binary template.

Alignment systems comprise an imaging device situated to obtain an image of a workpiece and a processor coupled to receive the image of the workpiece and establish a location of a fiducial on the workpiece by aligning a binary template with a region of interest in the image, projecting image values in at least portions of the region of interest along a direction associated with the aligned template, and processing the projected image values.

The foregoing and other objects, features, and advantages of the disclosed technology will become more apparent from the following detailed description, which proceeds with reference to the accompanying figures.

DETAILED DESCRIPTION

Introduction and Terminology

Disclosed herein are methods and apparatus that use localization of a template pattern for fiducial position detection. Typically, a single workpiece image is acquired and the template pattern is used with an image portion that includes a fiducial image. The aligned template pattern can be used to select image values that are projected along a template axis. The projected values extend across ROI image portions associated with the fiducial and can be processed by curve fitting or other procedures to locate the fiducial. Selection of ROI image portions can eliminate or reduce the influence of off-region artifacts and permit fiducials to be located without operator intervention. If different fiducial designs are to be used, corresponding template patterns can be provided, but processing remains otherwise substantially unchanged and no additional customization is generally required.

As used herein, "image" refers to visual presentation for viewing such by a technician, operator, or other person on display device, a projection on a surface such as projection screen, or otherwise presented for viewing. "Image" also refers to numerical representations of viewable images such as in image files in JPG, TIFF, BMP, or other formats. Such numerical representations include or are processable to produce values of intensity as a function of position, I(x,y), wherein x and y are coordinates along linearly independent (and typically orthogonal) axes. In the examples described herein, intensity is presented as a single value without reference to color as would be viewed by an observer. However, in some cases, intensity values associated with or more spectral components such as red, green, and blue, or other image values such as hue, saturation, and value, or color coordinates (for example LAB, CYMK, RGB) can be used. In many practical examples, the images of interest are charged-particle beam (CPB) images and a single intensity value is appropriate.

In the examples described below, a single image of a workpiece or a portion thereof is obtained at a first resolution and an image portion that includes a fiducial (a region of interest or ROI) is selected and magnified to provide an ROI that is associated with a second resolution that is larger than the first resolution. As used herein, image resolution is associated with image pixel size. A first image having image pixels associated with workpiece dimensions that are smaller than the pixels of a second image is referred to as "higher resolution." In typical examples, a first image (of a relatively large workpiece area) having a first resolution is processed to obtain an image portion associated with a ROI, i.e., an ROI image portion or ROI image. The ROI image portion can be scaled so that pixels in the ROI image correspond to smaller workpiece dimensions and the ROI images can be referred to as having a higher resolution than the first image. In some examples, images with pixel sizes of 50, 25, 10, or 5 nm are obtained and the associated ROI image have pixel sizes of 10, 5, 2, or 1 nm, respectively, but other resolutions and scaling can be used. For example, ROIs can be scaled by factors of 2, 4, 5, 10, 15, 20 or other factors. Selecting an ROI from a first image permits fiducial location based on a single image acquisition which can be faster and require less operator intervention.

The examples are illustrated with visual images in some figures but the operations used generally do not require operator intervention or viewable images. For example, templates that correspond to fiducials are illustrated as having transmissive or non-transmissive portions, but this refers to how the templates can be applied to image data and visual observation is not required.

For convenience, the disclosed templates are illustrated as binary masks having transmissive and opaque areas forming template patterns and are referred to herein simply as "templates."

Example 1

Figure 1:
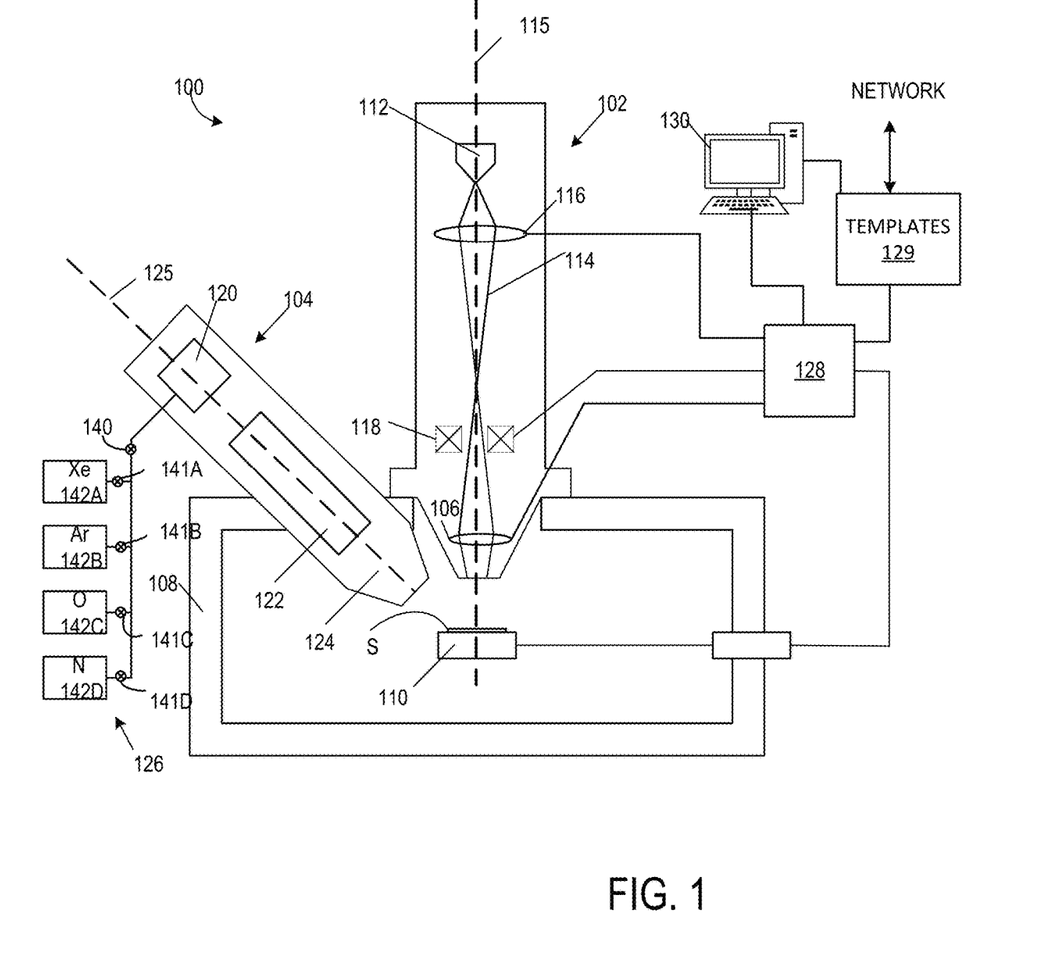
FIG. 1 illustrates a dual beam system that implements template-based fiducial location.

Referring to FIG. 1, in a representative embodiment, a dual-beam system 100 comprises a scanning electron microscope (SEM) 102 and an ion beam column 104.

The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens. The ion beam column 104 is arranged to provide a focused ion beam (FIB) to a sample S, and the SEM 102 is situated for production of an image of the sample S. The SEM 102 and the ion beam column 104 can be mounted to a vacuum chamber 108 housing a movable substrate holder 110 for holding a sample S. The vacuum chamber 108 can be evacuated using vacuum pumps (not shown). The substrate holder 110 can be movable in the X-Y plane as shown with respect to a coordinate system 150, wherein a Y-axis is perpendicular to a plane of the drawing. The substrate holder 110 can further move vertically (along a Z-axis) to compensate for variations in the height of the sample S. In some embodiments, the SEM 102 can be arranged vertically above the sample S and can be used to image the sample S, and the ion beam column 104 can be arranged at an angle and can be used to machine and/or process the sample S. FIG. 1 shows an exemplary orientation of the SEM 102 and the ion beam column 104. In some examples, a substrate holder can be tilted so that either an electron beam such as an SEM electron beam or an ion beam such as focused ion beam (FIB) can be applied from vertically below the sample for various milling or imaging operations.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the sample S. In some embodiments, the SEM 102 can be provided with a deflection unit 118 that can be configured to steer the beam 114. For example, the beam 114 can be steered in a scanning motion (e.g., a raster or vector scan) across a sample being investigated.

The dual-beam system 100 can further comprise a computer processing apparatus and/or a control unit 128 for controlling inter alia the deflection unit 118, charged particle beam (CPB) lenses 106, 116, and detectors (not shown), and for displaying information gathered from the detectors on a display unit. The control unit 128 can also control an ion beam 124 to mill or otherwise remove material from selected areas of the sample S otherwise process the specimen S. In some cases, a control computer 130 is provided to establish various excitations, control FIB milling, located fiducials and align the sample S using fiducials before or after ion beam milling operations, record imaging data, and generally control operation of both the SEM 102 and the ion beam column 104.

Referring still to FIG. 1, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the substrate, such as incising, milling, etching, depositing, etc.

In embodiments wherein the ion beam is a PFIB, the ion source 120 can be fluidly coupled to a plurality of gases via a gas manifold 126 that includes gas sources 142A-142D coupled by respective valves 141A-141D to the ion source 120. A valve 140 is situated to selectively couple gases from the gas manifold 126 to the ion source 120. Exemplary gases include, but are not limited to, xenon, argon, oxygen, and nitrogen as shown in FIG. 1. During operation of the ion source 120, a gas can be introduced, where it becomes charged or ionized, thereby forming a plasma. Ions extracted from the plasma can then be accelerated through the ion beam column 104, becoming an ion beam. While ion-beam milling is typical use, ion-beam assisted material deposition can also be accomplished with the dual beam system 100. A gas delivery system can be coupled to expose a surface of the sample S to a suitable gas via a gas inlet typically a precursor gas that consists of organometallic molecules. Fiducial location can be determined with the control computer 130. In some examples, substrates are provided with shields and/or fiducials prior to introduction into the dual beam system 100.

Templates for use in determining fiducial coordinates can be stored in a processor readable storage device 129 and communicated to the control computer 130 and/or the control unit 128. As indicated, templates can be received via a network such as a local area network (LAN) or wide area network (WAN). In addition, one or both of the control computer 130 and the control unit 128 can receive processor-executable instructions for fiducial coordinate determinations using the templates. These instructions can be stored in suitable local memory devices or stored remotely and communicated via a LAN or WAN.

Example 2

Figure 2:
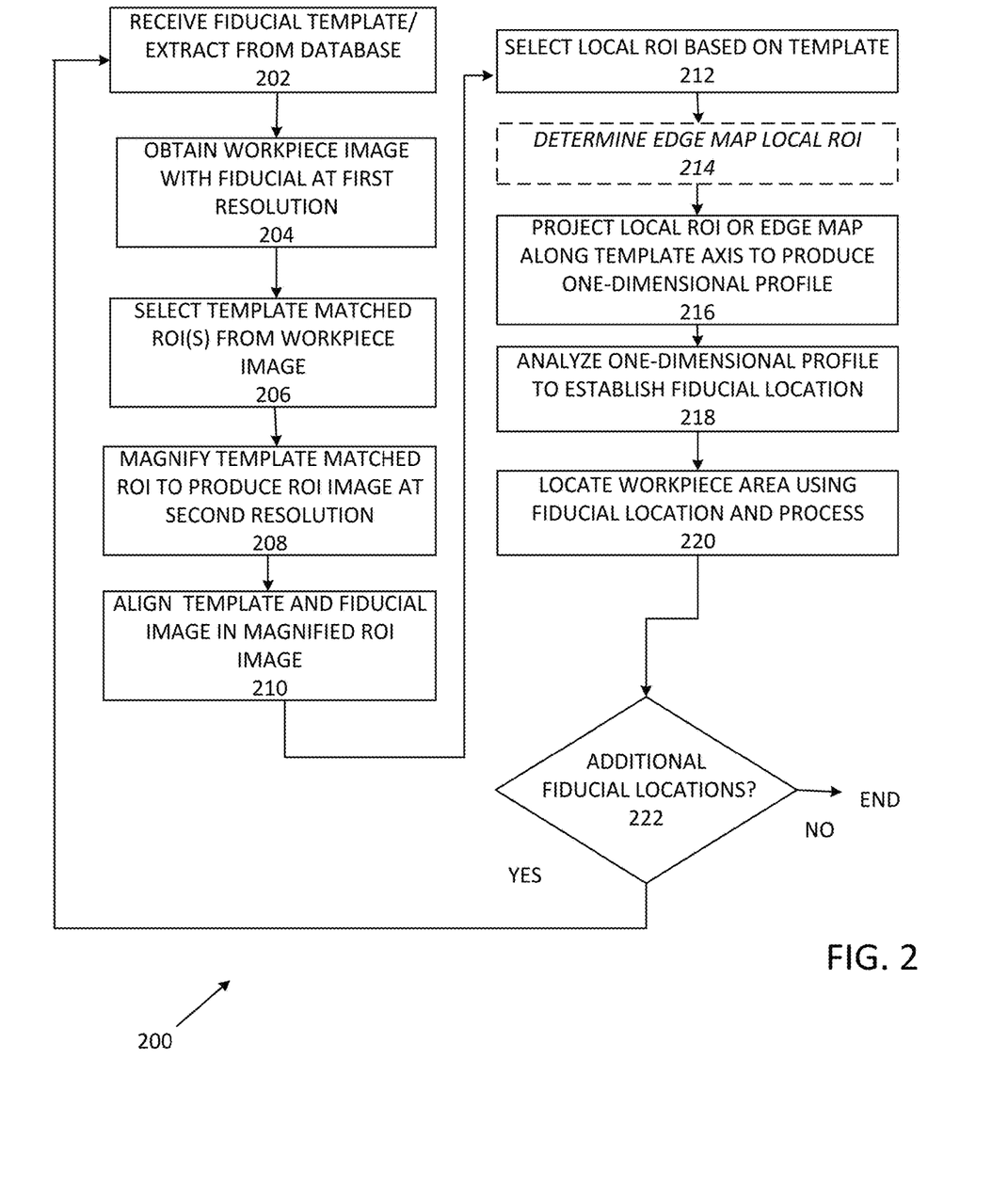
FIG. 2 illustrates a representative method of fiducial location.
Figure 3A:
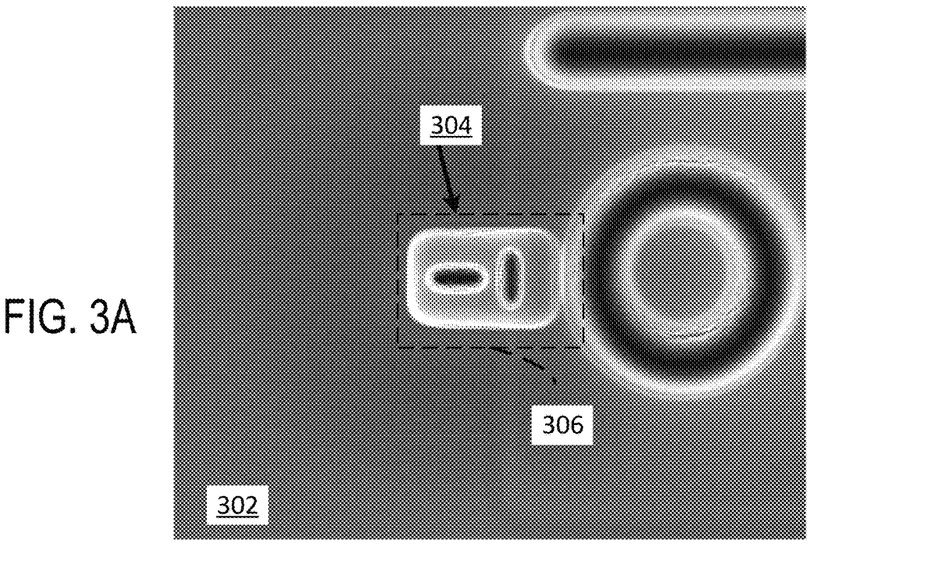
FIGS. 3A-3B are workpiece images illustrating template-based fiducial location.
Figure 3B:
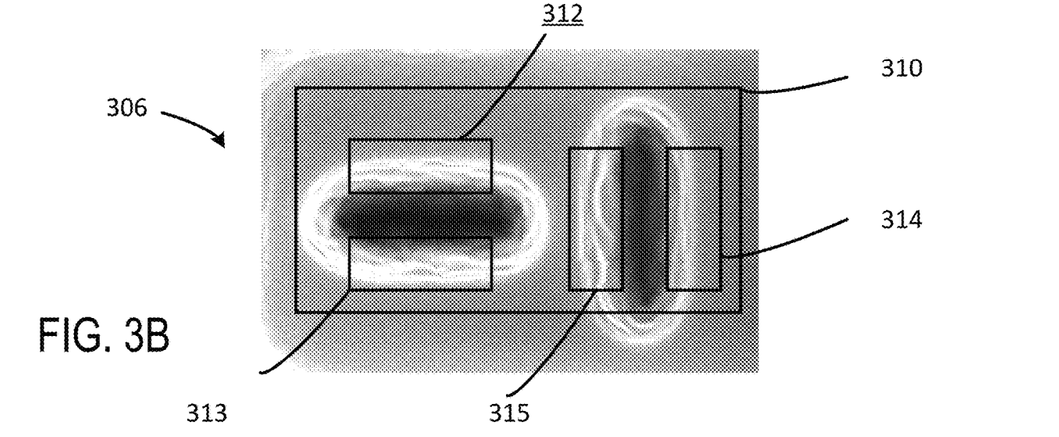

Methods for establishing fiducial locations are illustrated in FIGS. 2-3. Referring to FIG. 2, a representative method 200 includes receiving a fiducial template or extracting the fiducial template from a processor-readable storage device at 202. At 204, an image of a workpiece is obtained at a first resolution. At 206, a fiducial is located in the image and a corresponding region of interest (ROI) about the fiducial is selected. While the image can include one or more fiducial images, a fiducial closest to a feature of interest on the workpiece can be selected or another fiducial as may be convenient. At 208, the ROI is magnified to produce an ROI image at a second resolution that is greater than the first resolution. The selected template, the ROI, and magnification are selected so that template dimensions correspond to the fiducial image in the magnified ROI image. In the ROI image, pixel sizes are typically 4, 8, 16 or more times smaller than in the first resolution image. At 210, the template is aligned with the fiducial image in the magnified ROI by, for example, correlation. A local ROI is selected based on the aligned template at 212. If desired, an edge-finding procedure such as Sobel edge finding can be executed at 214 to locate fiducial edges and produce an edge map. At 216, the local ROI (or the edge map) can be projected along a template axis. This projection typically combines local ROI image data along the template axis and increases signal to noise ratio. The resulting one-dimensional profile (projected local ROI image data as a function of position transverse to the template axis) can be processed to establish the fiducial location at 218. Fiducial edges, midpoints, or other features can be used. At 220, a workpiece area is located based on the established fiducial location. Typically, relative coordinates of workpiece features can be obtained based on workpiece design and establishment of the fiducial location (coordinates) permits movement (translations or rotations) of the workpiece to a selected process area or deflection of a processing beam to the selected process area. At 220, the selected workpiece area (or areas) is processed by, for example, FIB milling. In other examples, inspection, measurement, material deposition, patterning, or other operations are performed. At 222, it is determined if additional fiducial locations are to be established. If so, processing can return to 202, but in some examples, the same template and/or the same workpiece image is reused, and processing can return to 204 or 206.

Example 3

FIG. 3A illustrates a workpiece image 302 that includes a representative fiducial image 304. A region of interest 306 of the image 302 that includes an image of the fiducial 304 is shown as magnified in FIG. 3B. A template 310 that includes apertures 312, 313 and 314, 315 is shown aligned with the fiducial 304; for convenient illustration, an outline of the template 310 is shown. Typically, the template 310 is a binary template that is transmissive at the apertures 312-315 and opaque elsewhere. However, templates having partially transmissive regions in addition to or instead of completely opaque and transmissive regions can be used. As shown, a template and a ROI image are selected so that template features (apertures) and fiducial image portions have corresponding dimensions. An ROI magnification can be varied to match a template or the template varied to match fiducial dimensions in an ROI image, or both.

Example 4

Figure 4A:
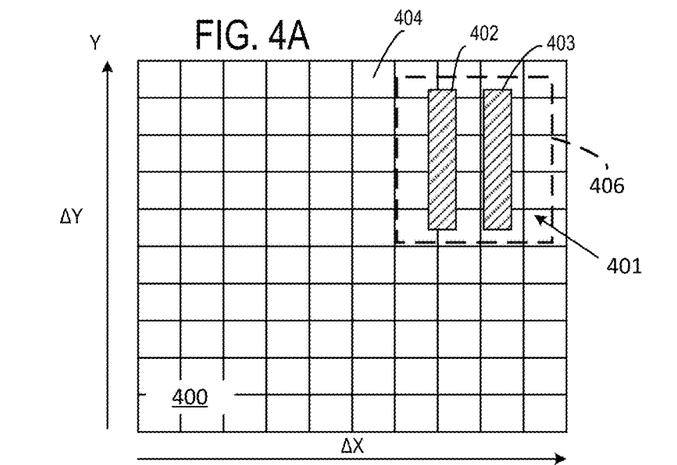
FIG. 4A is schematic representation of a workpiece image that includes an image of a fiducial in a region of interest (ROI).
Figure 4B:
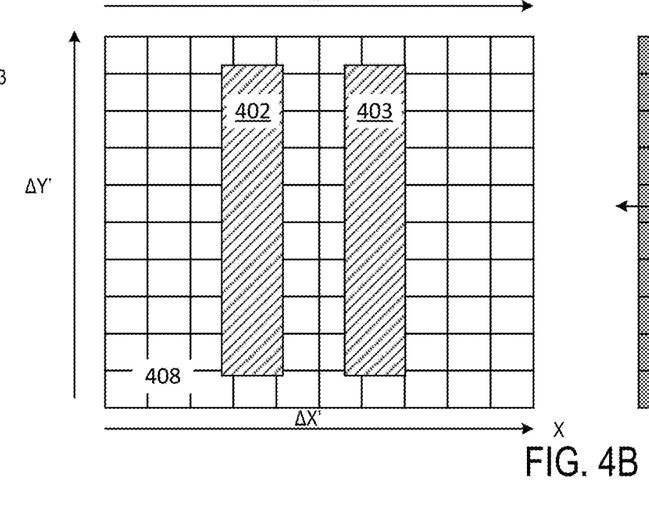
FIG. 4B illustrates a magnified image of the ROI shown in FIG. 4A.
Figure 4C:
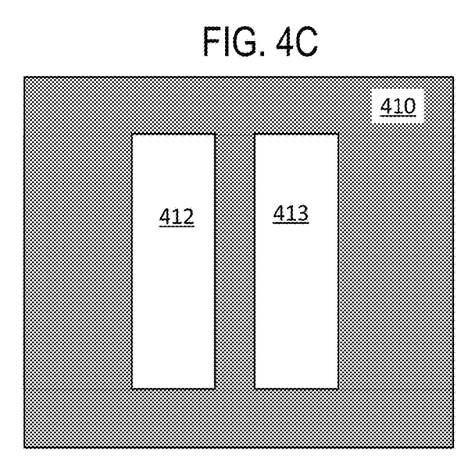
FIG. 4C illustrates a template corresponding to the fiducial image in the magnified ROI image.
Figure 4D:
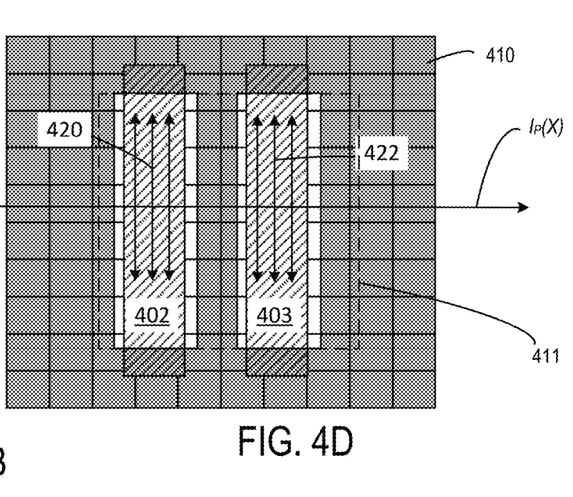
FIG. 4D illustrates alignment of the template and the magnified image of the ROI.

FIGS. 4A-4E illustrate methods such as discussed above but processing to match template feature and fiducial dimensions (if needed) is not illustrated. FIG. 4A is a schematic representation of a workpiece image 400 that includes a representative fiducial 401 comprising vertical strips 402, 404. For convenience, the workpiece image 400 is shown as divided into an array of rectangular pixels such as representative pixel 404, wherein each pixel is associated with an image intensity and coordinates, i.e., I(x,y). The array extends along orthogonal X- and Y-axes total distances $\Delta X$ and $\Delta Y$, respectively. An ROI image 406 can be selected from the workpiece image 400 and can be enlarged to produce the magnified ROI image 408 shown in FIG. 4B. The ROI image 408 has a relative magnification M with respect to the workpiece image 400 and has total X- and Y-extents $\Delta X'$ and $\Delta Y'$, respectively, with pixel dimensions M times smaller than in the workpiece image 400. FIG. 4C illustrates a template 410 that includes apertures 412, 413 that are sized to correspond to features 402, 403 of the template 410 with the magnification M. In FIG. 4D, the template 410 is illustrate superimposed on the ROI image 408 and aligned so that apertures 412, 413 are at template features 402, 403, respectively.

Figure 4E:
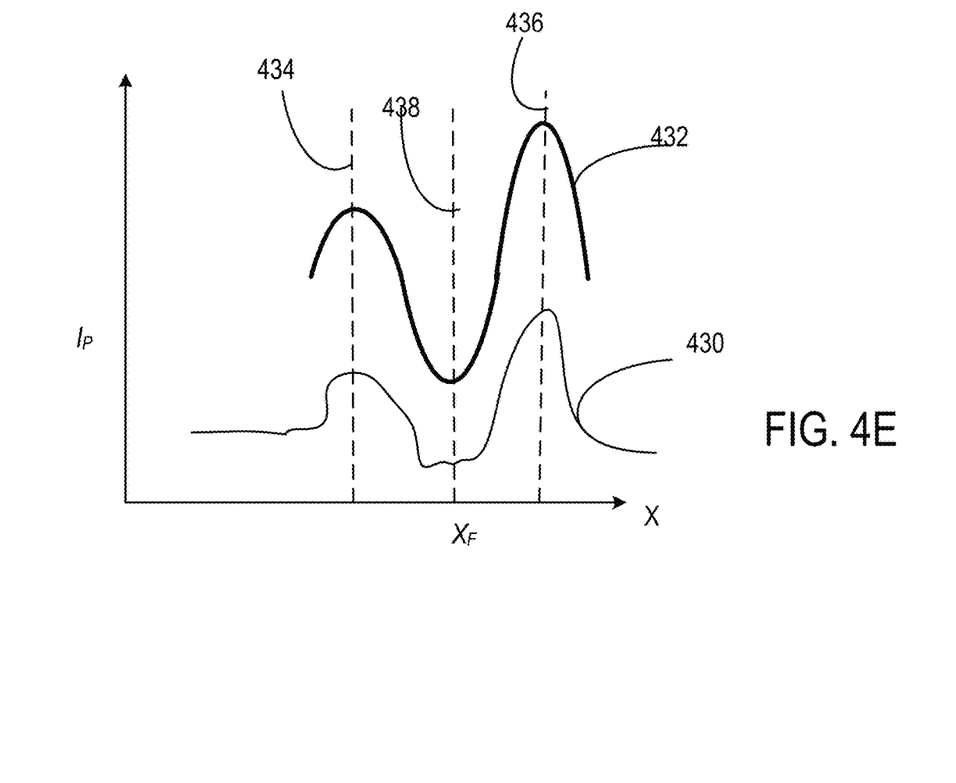
FIG. 4E illustrates a representative projection of image values and a curve fit to the projected image values.

To locate the fiducial and provide fiducial coordinates, image values (typically intensities) associated with pixels in the ROI image can be summed along directions indicated with arrows 420, 422 (Y-directions) to provide a projected intensity $I_P$ as a function of distance along the X-axis, i.e., $I_P(X)$. As used herein, combining in such a manner along an axis defined by a template is referred to as projecting the intensity values along a template axis. A template axis is generally oriented in a direction different from (such as orthogonal to) a direction along which a template location or template coordinate is to be determined. Intensity values are combined along the indicated directions, typically with an area 411 which can be smaller than the ROI image 408 and can include only intensities associated with the transmissive portion of a template or non-transmissive portions as well. The resulting projected intensity $I_P(X)$ can be scaled if desired, or a sum without scaling can be used. A representative example is shown in the graph of FIG. 4E. A projected intensity 430 is shown along with a curve fit 432 which permits superior location of X-coordinates associated with peaks 434, 436 and midpoint 438 between the peaks. While X-coordinates associated with peak values can be used to establish a fiducial coordinate, it is sometimes preferable to use an X-coordinate associated with a midpoint or minimum. As shown, the fiducial is determined to be at a location associated with an X-coordinate $X_F$.

In the example of FIGS. 4A-4E, only an X-coordinate associated with a fiducial is obtained and the template used is selected to provide X-location. Additional template features such as those shown in FIGS. 3A-3B are generally suited to X- and Y-coordinate determinations with processing as described about. Known fiducial coordinates then permit targeting of particular workpiece areas for processing or evaluation.

Example 5

Figure 5A:
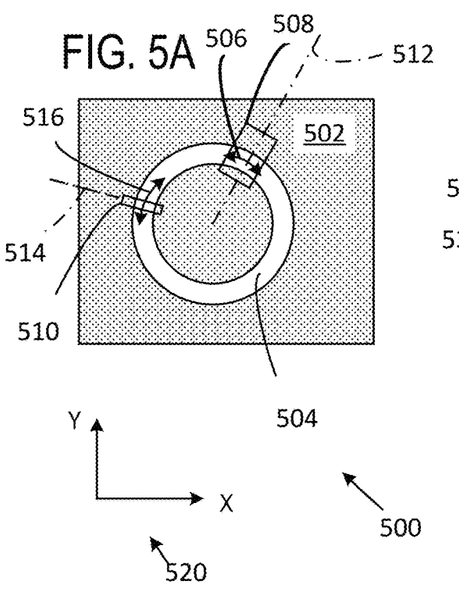
FIGS. 5A-5B illustrate additional templates for fiducial location.
Figure 5B:
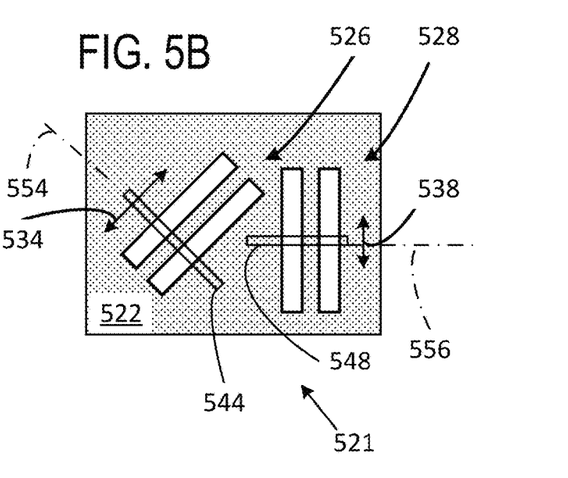

FIGS. 5A-5B illustrate additional examples of templates for use in fiducial location. Referring to FIG. 5A, a representative template 500 includes a non-transmissive area 502 in which a transmissive ring 504 is defined. The template 500 can be aligned with a fiducial image by correlation or other technique. Image data can be projected within an image area 508 which extends along a template axis 512 and can have a width transverse to the template axis 512 that corresponds to one, a few, or many pixels. The image data can be projected along a circumferential axis such as axis 506 or a linear axis to provide projected data that is a function of position transverse to the template axis 512. Image data can also be similarly projected within an image area 510 which extends along a template axis 514 and can have a width transverse to the template axis 514 that corresponds to one, a few, or many pixels. ROI image data within the image area 510 can be projected along a circumferential axis such as axis 516 or a linear axis to provide projected data that is a function of position transverse to the template axis 514. As shown, the templated axes 512, 514 need not be orthogonal and need not be parallel to coordinate axes of an XY-coordinate system 520. In this example, the template axes 512, 514 are tilted with respect to the coordinate axes 520. ROI image data associated with image areas 508, 510 can be processed to determine fiducial position along the axes 512, 514, respectively. These positions can be used to determine fiducial X- and Y-coordinates. The axes 512, 514 need not be orthogonal and any non-parallel axes can be used although orthogonal or near-orthogonal axes generally provide superior results.

Referring to FIG. 5B, a representative template 521 includes sets 526, 528 of transmissive slits in an opaque region 522. Image data associated with image portions near the sets 526, 528 can be projected along respective axes 534, 548 within image areas 544, 548 to provide projected image data that is a function of position along respective axes 554, 556. Evaluation of the accumulated image data permits determination of fiducial coordinates along the axes 554, 556 which can be transformed into X- and Y-coordinates.

Example 6

Figure 6:
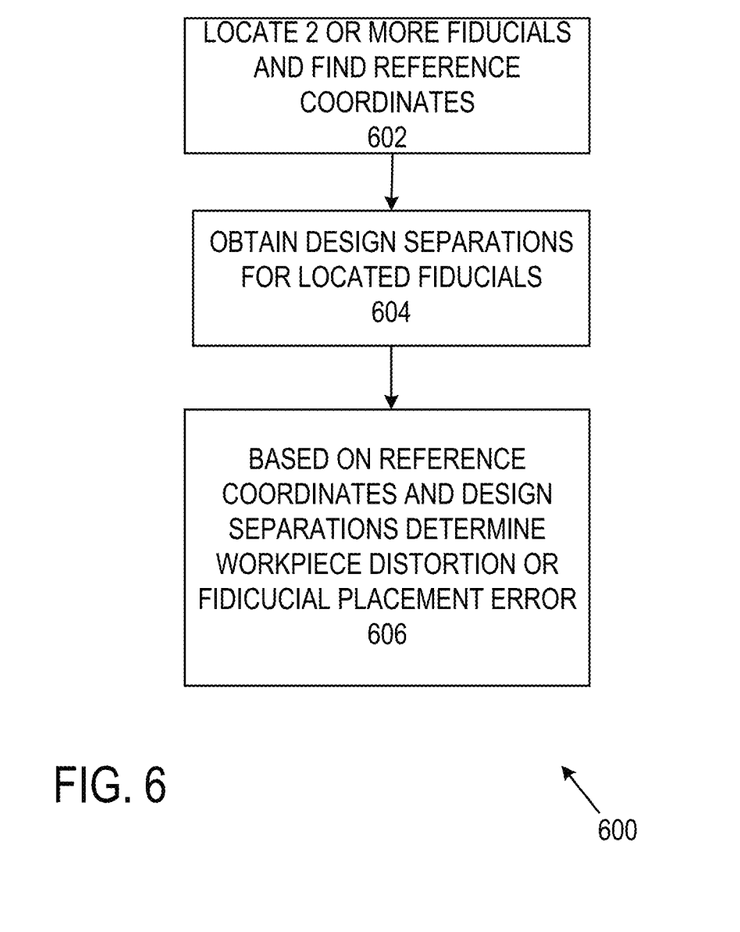
FIG. 6 illustrates a representative method of evaluating a work piece for patterning distortion.

Referring to FIG. 6, a method 600 includes establish locations of two or more fiducials as described above using templates based on fiducial shapes at 602. At 604, fiducial separation based on a workpiece design is obtained and at 606, workpiece pattern distortion can be determined by comparing measured fiducial separation with design separation. In further examples, three or more fiducials are located to determine workpiece rotation.

Example 7

Figure 7:
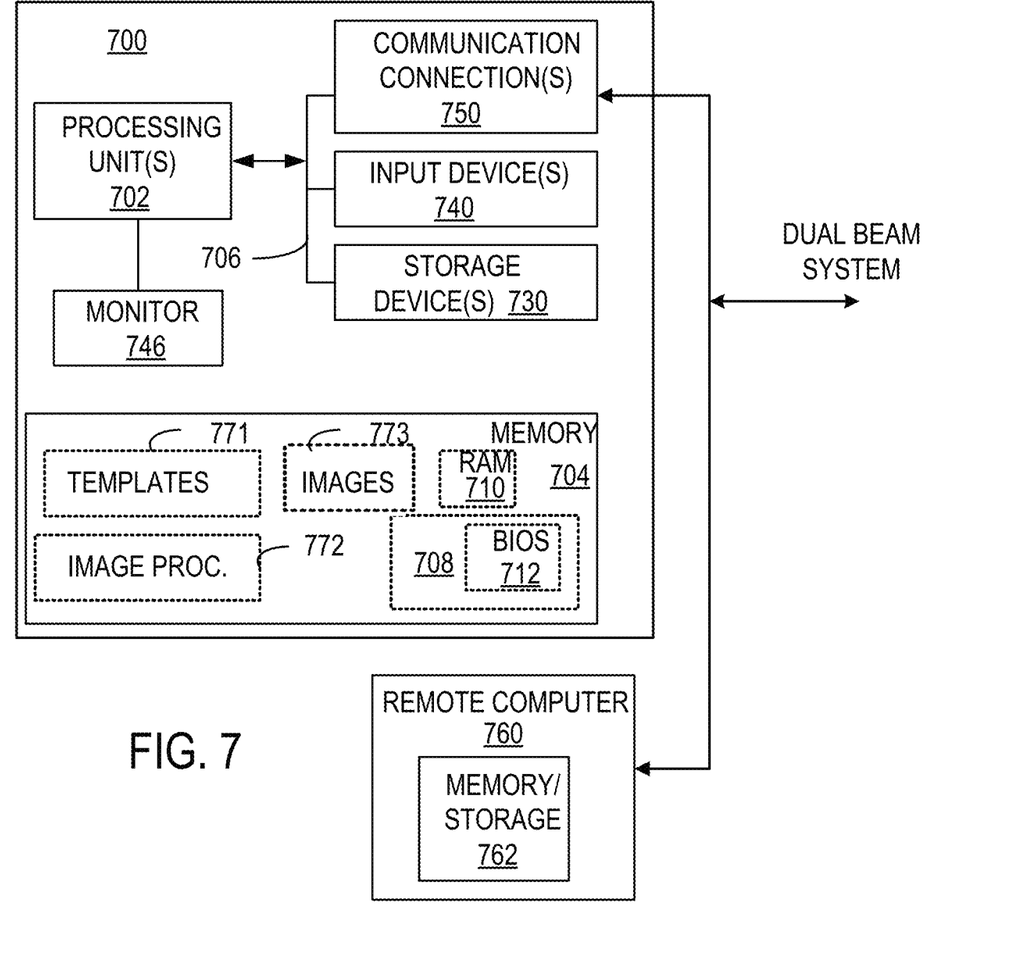
FIG. 7 is a block diagram of a representative processing system that implements template-based fiducial location.

FIG. 7 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 7, an exemplary system for implementing the disclosed technology includes a general purpose computing device in the form of an exemplary conventional PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read only memory (ROM) 708 and random access memory (RAM) 710. A basic input/output system (BIOS) 712, containing the basic routines that help with the transfer of information between elements within the PC 700, is stored in ROM 708. The memory 704 also contains portions 771-773 that include template data, computer-executable instructions for image processing such as magnification, template application, ROI selection, image data accumulations, as well as instructions for accumulated image data processing including curve fitting and extraction of fiducial coordinates, coordinate transforms, determination of workpiece rotation and distortion, respectively.

The exemplary PC 700 further includes one or more storage devices 730 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 706 by a hard disk drive interface, a magnetic disk drive interface, and an optical drive interface, respectively. The drives and their associated computer-readable media provide nonvolatile storage of computer-readable instructions, data structures, program modules, and other data for the PC 700. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 730 including an operating system, one or more application programs, other program modules, and program data. A user may enter commands and information into the PC 700 through one or more input devices 740 such as a keyboard and a pointing device such as a mouse. Other input devices may include a digital camera, microphone, joystick, game pad, satellite dish, scanner, or the like. These and other input devices are often connected to the one or more processing units 702 through a serial port interface that is coupled to the system bus 706, but may be connected by other interfaces such as a parallel port, game port, or universal serial bus (USB). A monitor 746 or other type of display device is also connected to the system bus 706 via an interface, such as a video adapter. Other peripheral output devices, such as speakers and printers (not shown), may be included.

The PC 700 may operate in a networked environment using logical connections to one or more remote computers, such as a remote computer 760. In some examples, one or more network or communication connections 750 are included. The remote computer 760 may be another PC, a server, a router, a network PC, or a peer device or other common network node, and typically includes many or all of the elements described above relative to the PC 700, although only a memory storage device 762 has been illustrated in FIG. 7. The personal computer 700 and/or the remote computer 760 can be connected to a logical a local area network (LAN) and a wide area network (WAN). Such networking environments are commonplace in offices, enterprise-wide computer networks, intranets, and the Internet.

When used in a LAN networking environment, the PC 700 is connected to the LAN through a network interface. When used in a WAN networking environment, the PC 700 typically includes a modem or other means for establishing communications over the WAN, such as the Internet. In a networked environment, program modules depicted relative to the personal computer 700, or portions thereof, may be stored in the remote memory storage device or other locations on the LAN or WAN. The network connections shown are exemplary, and other means of establishing a communications link between the computers may be used.

Representative Embodiments

Embodiment 1 is a method, including: obtaining an image of a workpiece at a first resolution and identifying a workpiece fiducial in the image; selecting a portion of the image of the workpiece at the first resolution that includes a workpiece fiducial image as a region of interest (ROI) image; processing the ROI image so that the ROI image has a second resolution that is greater than the first resolution; masking the ROI image with a template based on the workpiece fiducial; and processing the masked ROI image to establish at least one workpiece coordinate associated with the workpiece fiducial.

Embodiment 2 includes the subject matter of Embodiment 1, and further includes processing a workpiece area based on the at least one established workpiece coordinate.

Embodiment 3 includes the subject matter of any of Embodiments 1-2, and further specifies that the processing the workpiece area includes ion beam milling the workpiece area.

Embodiment 4 includes the subject matter of any of Embodiments 1-3, and further specifies that the template is a binary template.

Embodiment 5 includes the subject matter of any of Embodiments 1-4, and further specifies that at least one workpiece coordinate includes at least one of a first coordinate and a second coordinate along a first axis and a second axis, respectively, wherein the first axis and the second axis are linearly independent axes.

Embodiment 6 includes the subject matter of any of Embodiments 1-5, and further specifies that the at least one workpiece coordinate is established by identifying fiducial edges in the masked ROI image.

Embodiment 7 includes the subject matter of any of Embodiments 1-6, and further specifies that the at least one workpiece coordinate is established by projecting image values along at least one template axis and processing the projected image values.

Embodiment 8 includes the subject matter of any of Embodiments 1-7, and further specifies that the projected image values are functions of position along an axis transverse to the template axis and the at least one coordinate is obtained base on one or more of a maximum or minimum projected image value.

Embodiment 9 includes the subject matter of any of Embodiments 1-8, and further specifies that the processing the ROI image so that the ROI image has a second resolution that is greater than the first resolution includes magnifying the ROI image to correspond to the template Embodiment 10 includes the subject matter of any of Embodiments 1-9, and further specifies that the processing the ROI image so that the ROI image has a second resolution that is greater than the first resolution includes magnifying the ROI image to correspond to the template.

Embodiment 11 includes the subject matter of any of Embodiments 1-10, and further specifies that masking the ROI image with a template based on the workpiece fiducial includes magnifying the template based on a fiducial dimension in the ROI image.

Embodiment 12 is a dual charged particle beam (CPB) system, including: an electron microscope column situated to produce an image of a workpiece; an ion beam column situated to process the workpiece with an ion beam; and a memory device coupled to store at least one template associated with a workpiece fiducial design; and a processor coupled to: select a portion of the image of the workpiece at the first resolution that includes a workpiece fiducial image as a region of interest (ROI) image; processing the ROI image so that the ROI image has a second resolution that is greater than the first resolution; masking the ROI image with a template based on the workpiece fiducial; and processing the masked ROI image to establish at least one workpiece coordinate associated with the workpiece fiducial.

Embodiment 13 includes the subject matter of Embodiment 12, and further specifies that the processor is further configured to direct the ion beam to a workpiece location based on the at least one workpiece coordinate. processing a selected workpiece area based on the established workpiece coordinates.

Embodiment 14 includes the subject matter of any of Embodiments 12-13, and further specifies that ion beam is operable to mill the selected workpiece area.

Embodiment 15 includes the subject matter of any of Embodiments 12-14, and further specifies that the at least one workpiece coordinate is a fiducial coordinate and the processor is configured to determine at least one coordinate for a workpiece area to be processed based on the fiducial coordinate.

Embodiment 16 includes the subject matter of any of Embodiments 12-15, and further specifies that the at least one template is a binary template.

Embodiment 17 includes the subject matter of any of Embodiments 12-16, and further specifies that the processor is configured to establish workpiece coordinates with respect to first and second linearly independent axes based on the masked ROI image.

Embodiment 18 includes the subject matter of any of Embodiments 12-17, and further specifies that the processor is configured to establish workpiece coordinates with respect to first and second linearly independent axes based on the masked ROI image.

Embodiment 19 includes the subject matter of any of Embodiments 12-18, processor is configured to establish the workpiece coordinates a by identifying fiducial edges in the masked ROI image.

Embodiment 20 is an alignment system, including: an imaging device situated to obtain an image of a workpiece; and a processor coupled to receive the image of the workpiece and establish a location of a fiducial on the workpiece by aligning a binary template with a region of interest in the image, projecting image values in at least portions of the region of interest along a direction associated with the aligned template, and processing the projected image values.

In view of the many possible embodiments to which the principles of the disclosed technology may be applied, it should be recognized that the illustrated embodiments are only preferred examples and should not be taken as limiting in scope.

We claim:

1. A method, comprising:
    obtaining an image of a workpiece at a first resolution and identifying a workpiece fiducial in the image;
    selecting a portion of the image of the workpiece at the first resolution that includes a workpiece fiducial image as a region of interest (ROI) image;
    processing the ROI image so that the ROI image has a second resolution that is greater than the first resolution;
    masking the ROI image with a template based on the workpiece fiducial, the template including at least one aperture; and
    processing a portion of the masked ROI image within an area defined by the at least one aperture to establish at least one workpiece coordinate associated with the workpiece fiducial, wherein the at least one workpiece coordinate is established by summing image intensity values of the portion of the masked ROI image within the area defined by the at least one aperture along at least one template axis and processing the sums of the image intensity values to obtain the workpiece coordinate associated with a direction perpendicular to the at least one template axis.

2. The method of claim 1, further comprising processing a workpiece area based on the at least one established workpiece coordinate.

3. The method of claim 2, wherein the processing the workpiece area includes ion beam milling the workpiece area.

4. The method of claim 1, wherein the template is a binary template that obscures the masked ROI image except for the portion with the area defined by the at least one aperture of the template.

5. The method of claim 1, wherein at least one workpiece coordinate includes at least one of a first coordinate and a second coordinate along a first axis and a second axis, respectively, wherein the first axis and the second axis are linearly independent axes.

6. The method of claim 1, wherein the at least one workpiece coordinate is established by identifying fiducial edges in the masked ROI image.

7. The method of claim 1, wherein the summed image intensity values are functions of position along an axis transverse to the template axis and the at least one coordinate is obtained based on one or more of a maximum or minimum summed image intensity value.

8. The method of claim 1, wherein the summed image intensity values are functions of position along an axis transverse to the template axis and the at least one coordinate is obtained based on a minimum projected image value.

9. The method of claim 1, wherein the processing the ROI image so that the ROI image has a second resolution that is greater than the first resolution includes magnifying the ROI image to correspond to the template.

10. The method of claim 1, wherein masking the ROI image with a template based on the workpiece fiducial includes magnifying the template based on a fiducial dimension in the ROI image.

11. A dual charged particle beam system, comprising:
    an electron microscope column situated to produce an image of a workpiece at a first resolution;
    an ion beam column situated to process the workpiece with an ion beam; and
    a memory device coupled to store at least one template associated with a workpiece fiducial design; and
    a processor coupled to:
    select a portion of the image of the workpiece at the first resolution that includes a workpiece fiducial image as a region of interest (ROI) image;
    processing the ROI image so that the ROI image has a second resolution that is greater than the first resolution;
    masking the ROI image with a template based on the workpiece fiducial, the template including at least one aperture; and
    processing a portion of the masked ROI image within an area defined by the at least one aperture to establish at least one workpiece coordinate associated with the workpiece fiducial, wherein the at least one workpiece coordinate is established by summing image intensity values of the portion of the masked ROI image defined by the at least one aperture along at least one template axis and processing the sums of the image intensity values to obtain the workpiece coordinate associated with a direction perpendicular to the at least one template axis.

12. The dual charged particle beam system of claim 11, wherein the processor is further configured to direct the ion beam to a workpiece location based on the at least one workpiece coordinate for processing a selected workpiece area based on the established workpiece coordinates.

13. The dual charged particle beam system of claim 11, wherein ion beam is operable to mill a selected workpiece area.

14. The dual charged particle beam system of claim 11, wherein the at least one workpiece coordinate is a fiducial coordinate and the processor is configured to determine at least one coordinate for a workpiece area to be processed based on the fiducial coordinate.

15. The dual charged particle beam system of claim 11, wherein the at least one template is a binary template.

16. The dual charged particle beam system of claim 11, wherein the processor is operable to match fiducial and template feature dimensions in the ROI prior to masking the ROI with template.

17. The dual charged particle beam system of claim 11, wherein the processor is configured to establish workpiece coordinates with respect to first and second linearly independent axes based on the masked ROI image.

18. The dual charged particle beam system of claim 11, wherein the processor is configured to establish the workpiece coordinates a by identifying fiducial edges in the masked ROI image.

19. An alignment system, comprising:
- an imaging device situated to obtain an image of a workpiece; and
- a processor coupled to receive the image of the workpiece and establish at least one workpiece coordinate of a workpiece fiducial by aligning a binary template with a region of interest (ROI) in the image, wherein the at least one workpiece coordinate is established by summing image intensity values of the ROI image within an area defined by the binary template along at least one template axis and processing the sums of the image intensity values to obtain the workpiece coordinate associated with a direction perpendicular to the at least one template axis.

* * * * *

UNITED STATES PATENT AND TRADEMARK OFFICE
CERTIFICATE OF CORRECTION

PATENT NO. : 12,254,645 B2
APPLICATION NO. : 17/457622
DATED : March 18, 2025
INVENTOR(S) : Umesh Adiga et al.

It is certified that error appears in the above-identified patent and that said Letters Patent is hereby corrected as shown below:

In the Claims

In Column 13, Line 11, Claim 18, delete "a by" and insert -- by --, therefor.

Signed and Sealed this
Twenty-ninth Day of April, 2025

Coke Morgan Stewart
*Acting Director of the United States Patent and Trademark Office*